US012754222B2

(12) United States Patent
Hassan

(10) Patent No.: US 12,754,222 B2
(45) Date of Patent: Oct. 6, 2026

(54) MULTIPLEXED READOUT OF QUANTUM DEVICES

(71) Applicant: FERMI RESEARCH ALLIANCE, LLC, Batavia, IL (US)

(72) Inventor: Mohamed Hamed Awida Hassan, Aurora, IL (US)

(73) Assignee: Fermi Forward Discovery Group, LLC, Chicago, IL (US)

( * ) Notice: Subject to any disclaimer, the term of this patent is extended or adjusted under 35 U.S.C. 154(b) by 203 days.

(21) Appl. No.: 18/684,577

(22) PCT Filed: Aug. 17, 2022

(86) PCT No.: PCT/US2022/040655
§ 371 (c)(1),
(2) Date: Feb. 16, 2024

(87) PCT Pub. No.: WO2023/023194
PCT Pub. Date: Feb. 23, 2023

(65) Prior Publication Data
US 2024/0377444 A1 Nov. 14, 2024

Related U.S. Application Data

(60) Provisional application No. 63/234,163, filed on Aug. 17, 2021.

(51) Int. Cl.
*G01R 29/08* (2006.01)
*G02F 3/00* (2006.01)
*G06N 10/40* (2022.01)

(52) U.S. Cl.
CPC .......... *G01R 29/0871* (2013.01); *G02F 3/00* (2013.01); *G06N 10/40* (2022.01)

(58) Field of Classification Search
CPC ........ G01R 29/0871; G06N 10/40; G02F 3/00
USPC .............. 326/3; 327/524, 527, 528; 977/932
See application file for complete search history.

(56) References Cited

U.S. PATENT DOCUMENTS

| | | | | |
|---|---|---|---|---|
| 10,171,077 | B2 * | 1/2019 | Abdo | G06N 10/40 |
| 10,650,322 | B1 | 5/2020 | Temme et al. | |
| 2011/0152104 | A1 | 6/2011 | Farinelli et al. | |
| 2018/0285760 | A1 * | 10/2018 | Abdo | H01P 1/213 |

(Continued)

FOREIGN PATENT DOCUMENTS

WO 2021061776 A1 4/2021

OTHER PUBLICATIONS

Wideband Radial Power Combiner Sayyed-Hossein et al School of New Technologies and Antenna and Microwave Research Laboratory, Iran University of Science and Technology, (Year: 2019).*

(Continued)

*Primary Examiner* — Arnold M Kinkead
(74) *Attorney, Agent, or Firm* — LOZA & LOZA, LLP; Kevin L. Soules

(57) ABSTRACT

A system and apparatus for multiplexed readout of quantum devices comprises at a radial combiner comprising a center feed line, a radial line, and a waveguide port and a filter operably connected to the radial combiner. The filter can comprise a dual mode filter providing an elliptical filter response. The system includes a port connecting each of the radial combiner sand the filters. The system further comprises at least one readout cavity.

18 Claims, 13 Drawing Sheets

(56) References Cited

U.S. PATENT DOCUMENTS

| | | | | |
|---|---|---|---|---|
| 2019/0019098 | A1 | 1/2019 | Przybysz | |
| 2024/0289289 | A1* | 8/2024 | Fang | G06F 13/36 |

OTHER PUBLICATIONS

International Search Report and Written Opinion, International Patent Application No. PCT/US2022/040655, Feb. 2, 2023, 10 pgs.

* cited by examiner

190

MULTIPLEXED READOUT OF QUANTUM DEVICES

CROSS REFERENCE TO RELATED PATENT APPLICATIONS

This application claims the priority and benefit under 35 U.S.C. § 119(e) of U.S. Provisional Patent Application Ser. No. 63/234,163 filed Aug. 17, 2021, entitled "MULTIPLEXED READOUT OF QUANTUM DEVICES." U.S. Provisional Patent Application Ser. No. 63/234,163 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

The embodiments are generally related to the field of readout devices. Embodiments further relate to the field of quantum devices. Embodiments are further related to the field of quantum computing. Embodiments are also related to multiplexing communication from quantum computers. Embodiments are further related to quantum sensing.

BACKGROUND

Quantum computing offers a new frontier in computing technology. Quantum computers may be capable of vastly increasing the computing power currently available using classic computers. Even supercomputers are unlikely to rival the speed and computing power of quantum computers A "qubit" is the quantum computing equivalent of a bit in a classical computer. A bit is a means of encoding information, either as a zero or a one. In quantum computing, the qubit represents a similar mechanism for encoding information. However, in the case of qubits the state can be a zero, one, or a linear combination of those states simultaneously. As a result of the superposition of states possible in a qubit, quantum computers are situated to address certain computing problems much faster than classical computers.

Although quantum computing shows enormous promise, practically speaking there remain significant challenges to realizing the potential benefits. For example, in a multi-qubit superconducting quantum system, each qubit is typically coupled to a readout resonator that is used as a mean to infer the state of the qubit using the readout resonance frequency. In such a system, each qubit-resonator will have an input signal to control the qubit state, another readout input, and output signals dedicated to readout the state of the qubit through the resonator transfer function. Thus, for each qubit, three lines are required. The cost for each readout channel can presently range from $50,000 to $100,000. In a system with, for example, 10 qubits, 30 lines could be required, each of which is so expensive that the system as a whole is both, very complex and prohibitively expensive.

Superconducting quantum systems operate at ultra-low temperature (~20 mK) inside dilution refrigerators. The heat load of such refrigerators at such ultra-low temperatures is very limited and creates a bottleneck on scaling up quantum systems, as any additional mass associated with additional cabling and accessories will consume the limited heat load.

FIG. 4A provided herein and labeled prior art, illustrates a block diagram of a prior art approach and associated heat gradient.

As such, multiplexed readout of quantum devices is critically important for enabling engineering technology for complex quantum devices that have a large number of qubits. The systems and methods disclosed herein address this need.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide for an improved system and method for multiplexed readout of quantum devices.

It is another aspect of the disclosed embodiments to provide for the readout of qubits with fewer input and/or output cryogenic lines.

The aforementioned aspects and other objectives and advantages can now be achieved as described herein. For example, in an embodiment, a system for multiplexed readout of quantum devices, comprises at least one radial combiner and at least one filter operably connected to the radial combiner. In an embodiment, the filter comprises a dual mode filter. In an embodiment, the dual mode filter provides an elliptical filter response. In an embodiment, the system for multiplexed readout of quantum devices further comprises a port connecting each of the at least one radial combiner and the at least one filter. In an embodiment, the radial combiner comprises a center feed line, at least one radial line, and at least one waveguide port. In an embodiment, the center feed line further comprises a waveguide section and a mode transducer section. In an embodiment, the system for multiplexed readout of quantum devices further comprises at least one readout cavity. the readout cavity can comprise an RF cavity for reading out qubits.

In another embodiment, a system for multiplexed readout of quantum devices comprises a first multiplexer configured to accept an input, a plurality of readout cavities operably connected to said first multiplexer, and a second multiplexer operably connected to the plurality of readout cavities, the second multiplexer configured to provide an output. In an embodiment, the first multiplexer comprises at least one radial combiner, and at least one filter operably connected to the radial combiner, and wherein the second multiplexer comprises at least one radial combiner and at least one filter operably connected to the radial combiner. In an embodiment, wherein each of the respective filters comprises a dual mode filter. The dual mode filter provides an elliptical filter response. In an embodiment, a port connects each of the at least one radial combiner and the at least one filter. In an embodiment, the radial combiner comprises a center feed line, at least one radial line, and at least one waveguide port. In an embodiment, each of the plurality of readout cavities comprises an RF cavity for reading out qubits.

In another embodiment, a system for multiplexed readout of quantum devices, comprises a first multiplexer configured to accept an input, a plurality of input scaling multiplexers attached to the first multiplexer, a plurality of readout cavities operably connected to the plurality of input scaling multiplexers, a plurality of output scaling multiplexers operably connected to the plurality of readout cavities, and a second multiplexer operably connected to the plurality of output scaling multiplexers, the second multiplexer configured to provide an output. In an embodiment, the first multiplexer comprises: at least one radial combiner and at least one filter operably connected to the radial combiner; and the second multiplexer comprises: at least one radial combiner and at least one filter operably connected to the radial combiner. In an embodiment, the plurality of input scaling multiplexers each comprises at least one radial combiner and at least one filter operably connected to the radial combiner; and the plurality of output scaling multiplexers each comprises: at least one radial combiner and at least one filter operably connected to the radial combiner. In an embodiment, each of the respective filters comprises a dual mode filter. In an embodiment each of the plurality of readout cavities comprises an RF cavity for reading out qubits.

BRIEF DESCRIPTION OF THE FIGURES

The accompanying figures, in which like reference numerals refer to identical or functionally similar elements throughout the separate views and which are incorporated in and form a part of the specification, further illustrate the embodiments and, together with the detailed description, serve to explain the embodiments disclosed herein.

DETAILED DESCRIPTION

Figure 1A:
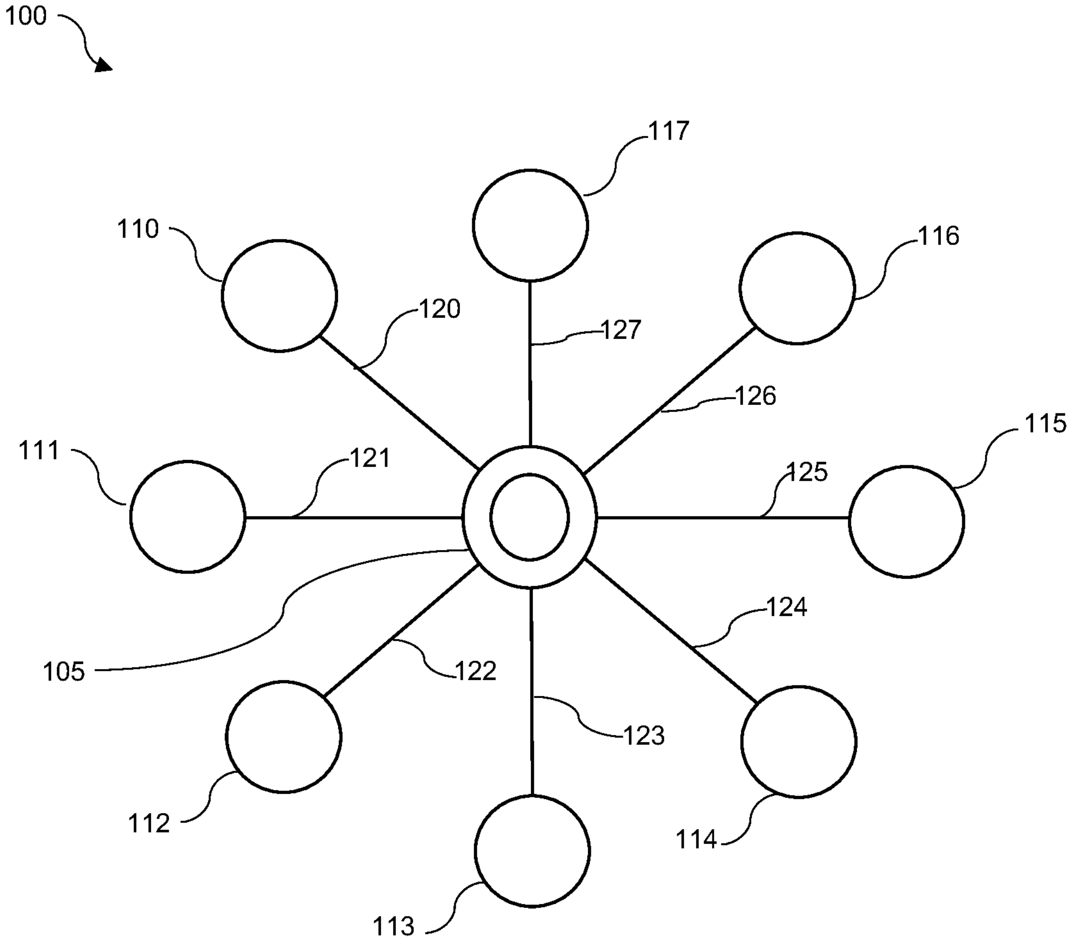
FIG. 1A illustrates multiplexer in accordance with the disclosed embodiments.

The particular values and configurations discussed in the following non-limiting examples can be varied, and are cited merely to illustrate one or more embodiments, and are not intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," a used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "In another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations. The principal features can be employed in various embodiments without departing from the scope disclosed herein. Those skilled in the art will recognize, or be able to ascertain, using no more than routine experimentation, numerous equivalents to the specific procedures described herein. Such equivalents are considered to be within the scope of the disclosed embodiments and are covered by the claims.

The use of the word "a" or "an" when used in conjunction with the term "comprising in the claims and/or the specification may mean "one," but it is also consistent with the meaning of "one or more," at "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of "having," such as "have" and "has"), "including" (and any form of "including," such as "includes" and "include") or "containing" (and any form of "containing," such as "contains" and "contain") are inclusive or open-ended and do not exclude additional, un-recited elements or method steps.

All of the compositions and/or methods disclosed and claimed herein can be made and executed without undue experimentation in light of the present disclosure. While the compositions and methods have been described in terms of preferred embodiments, it will be apparent to those of skill in the art that variations may be applied to the compositions and/or methods and in the steps, or in the sequence of steps, of the method described herein without departing from the concept, spirit, and scope of the disclosed embodiments. All such similar substitutes and modifications apparent to those skilled in the art are deemed to be within the spirit, scope and concept as defined by the appended claims.

Figure 11:
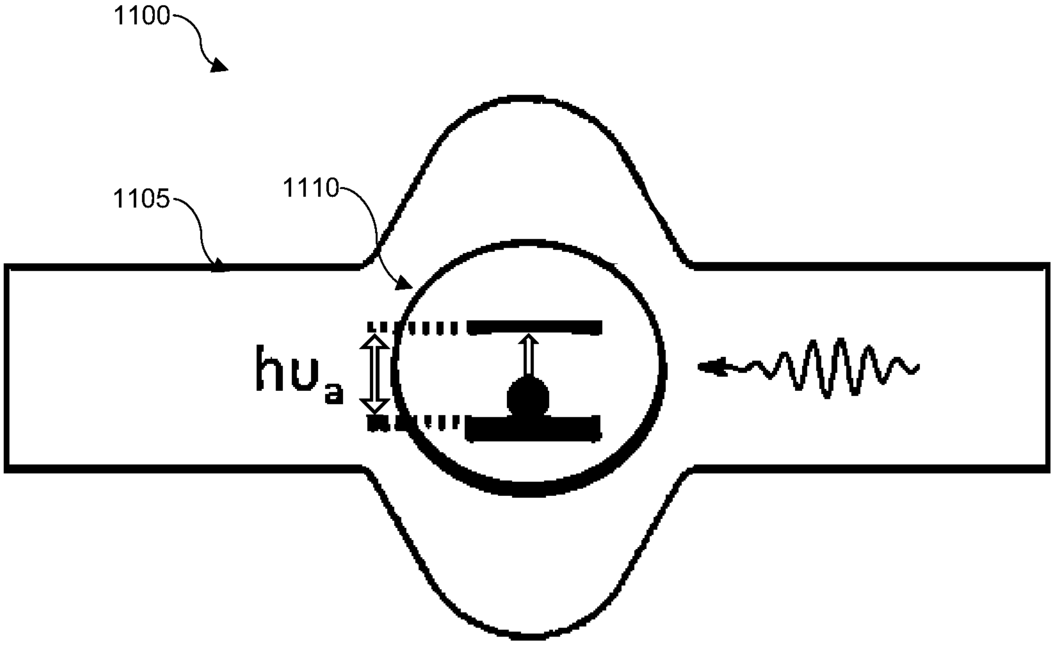
FIG. 11 depicts a two level system in a cavity, in accordance with the disclosed embodiments.

In the context of quantum computing, a qubit can be realized as an artificial atom with two levels, ostensibly a two-level system. FIG. 11 illustrates an exemplary two level system 1100 including a resonator 1105 and an atom 1110 therein. In the embodiments disclosed herein, the two-level system can be coupled to a resonator for purpose of reading its state. If the artificial atom is in an excited state the output will be one frequency, while if the atom is in a ground state the output will be a different frequency. While this is useful, the system needs to be kept in a special cryostat 475 (dilution refrigerator) near absolute 0 K temperature to reduce noise to the greatest extent possible, because the quantum state is very fragile. The signal must be routed through the dilution refrigerator, filtered, and amplified when sent to room temperature electronics for readout.

The disclosed systems and methods are directed to multiplexing RF communication for quantum computing devices with more than one qubit. In order to read the state of a qubit it can be tied to a readout resonator. The qubit state can be visualized as encoded data with a value of zero, one, or a superposition of zero and one. The resonator is used to read the qubit state. The disclosed systems and methods are configured to read multiple qubits with a single input/output line, which greatly reduces the overhead associated with electronics required to readout the qubit state and save the limited heat load power of the refrigerator. In the embodiments disclosed herein, multiple resonators can be used to read qubit states at the same time.

It is noteworthy that signals from a resonator are very small so even nominal losses on an output line can compromise the integrity of the readout. Likewise, cross talk between qubits is a significant source of error, so it is important that qubits be isolated from one another.

As illustrated herein, the disclosed multiplexed readout system can be used to host multiple qubits. This is an advantageous solution because the system offers low insertion loss and good isolation between the various readout resonators. In the embodiments disclosed herein, a central line can route the signal with radial branches to multiple readout resonators. Each resonator can host a qubit.

Figure 1B:
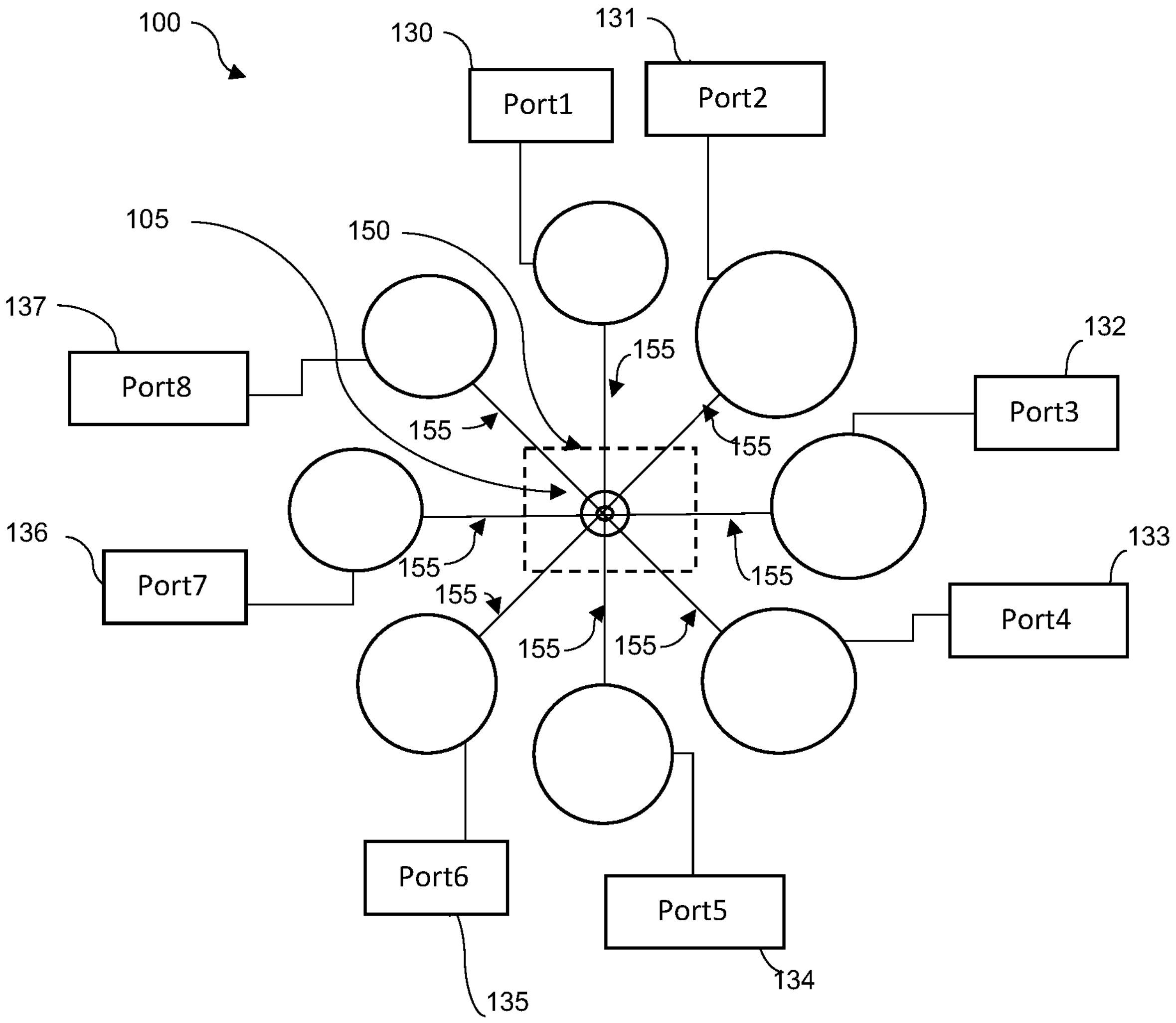
FIG. 1B illustrates multiplexer in accordance with the disclosed embodiments.

FIGS. 1A and 1B illustrate, an exemplary one to eight microwave multiplexer system 100 in accordance with the disclosed embodiments. The system 100 includes a radial combiner 105 configured in the center of the multiplexer system 100. In certain embodiments, the radial combiner can comprise a center feed 150, a radial line 155, and exterior waveguide ports. The center feed can generally comprise a waveguide section and mode transducer section. In other embodiments, other radial combiners can also be used without departing from the scope of this disclosure.

The radial combiner 105 is connected via ports 130-137 to filters 110-117 configured on each line 120-127. In certain embodiments, the filters 110 can comprise dual mode filters. The filter on each line is selected to only accept frequency from the desired qubit cavity.

The radial distribution architecture illustrated in FIGS. 1A and 1B is advantageous because it can easily be scaled to operate with more or fewer qubits, without introducing additional insertion loss, which is a serious problem in architecture that uses sequential division. This is particularly true for quantum computing because the signal into a qubit is attenuated. Thus, controlling thermal noise or input excitation is important so that it doesn't overwhelm the quantum state working only at the level of hundred photons. As such, it is critical to avoid insertion loss to the output signal to the greatest extent possible.

Figure 1C:
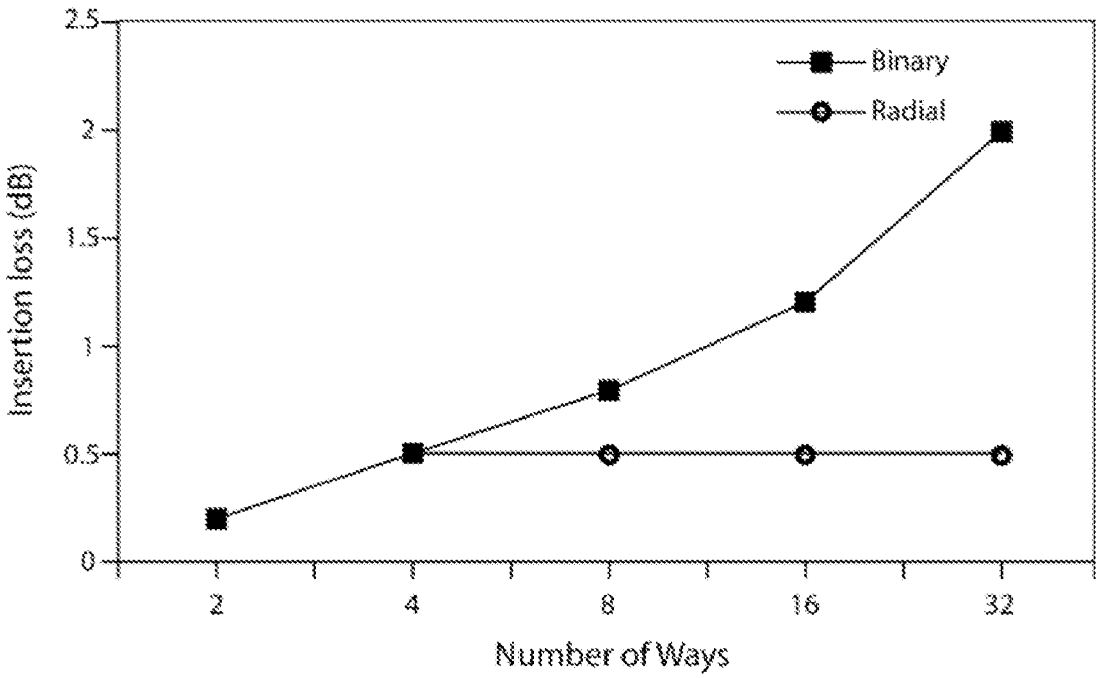
FIG. 1C illustrates a chart of insertion loss associated with radial versus binary microwave signal combiners, in accordance with the disclosed embodiments.

The multiplexer system 100 illustrated in FIGS. 1A and 1B utilizes a radial splitting/combining scheme which is efficient for large numbers of outputs as compared to a binary scheme. FIG. 1C illustrates this in chart 190 showing insertion loss of the splitter/combiner as a function of the number of ways. As chart 190 illustrates insertion loss increases as significantly as the number of ways increases, for a binary combiner. By contrast, insertion losses remain constant for increased ways for a radial combiner as disclosed herein.

Figure 2:
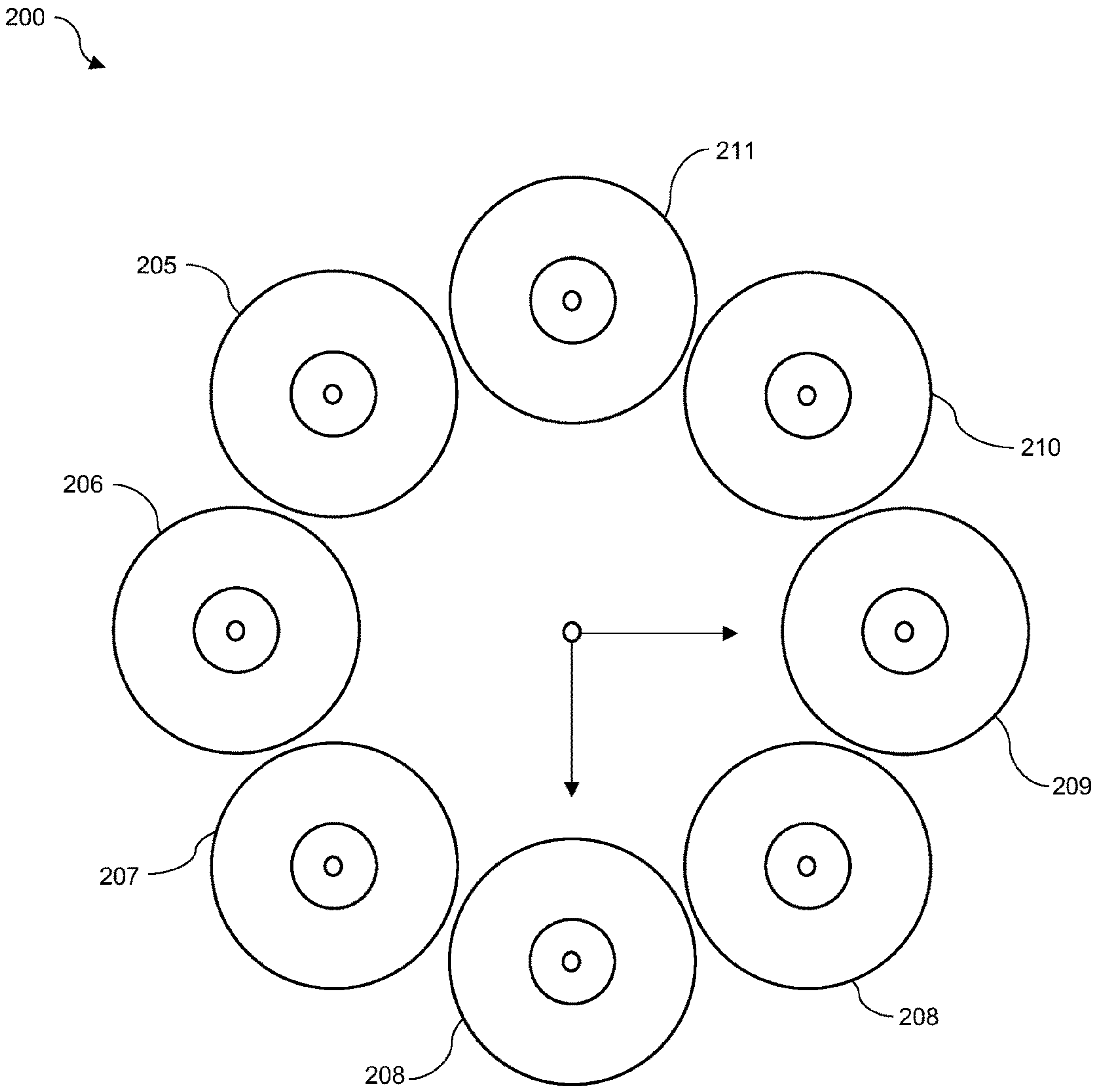
FIG. 2 illustrates architecture associated with a system including eight independent readout resonators, in accordance with the disclosed embodiments.

FIG. 2 illustrates another embodiment of a multi independent readout cavity system 200 in accordance with the disclosed embodiments. The system 200 can include a plurality of independent readout cavities. The exemplary embodiment illustrated in FIG. 2 includes eight readout cavities 205-212. However, in other embodiments, a different number of cavities can be used without departing from the scope disclosed herein. As used herein a readout cavity comprises a resonator 1105 and an atom 1110 as illustrated in FIG. 11. The system 200, requires independent readout out of each readout resonator/cavity necessitating complex input and output line instrumentation.

The system 100, can be used with system 200 to distribute a signal and collect it back from the independent cavities 205-212. In certain embodiments, each of the cavities 205-212 can have a different staggered frequency. Likewise, each line in the multiplexer system 100 can include a filter configured to reduce insertion loss. Out-band rejection via the dual-mode filters, may be used to reduce cross talk between various channels. In certain embodiments, arbitrary wave form generators can be used to excite the system and digitizers, after proper frequency down-conversion, can be used to read it out. In this way the interference between the respective cavities 205-212 can be minimized. In this embodiment, two multiplexers 100 can be used to distribute a signal and then collect the signal back from the eight independent readout cavities 205-212, each of which is staggered in frequency.

Figure 3:
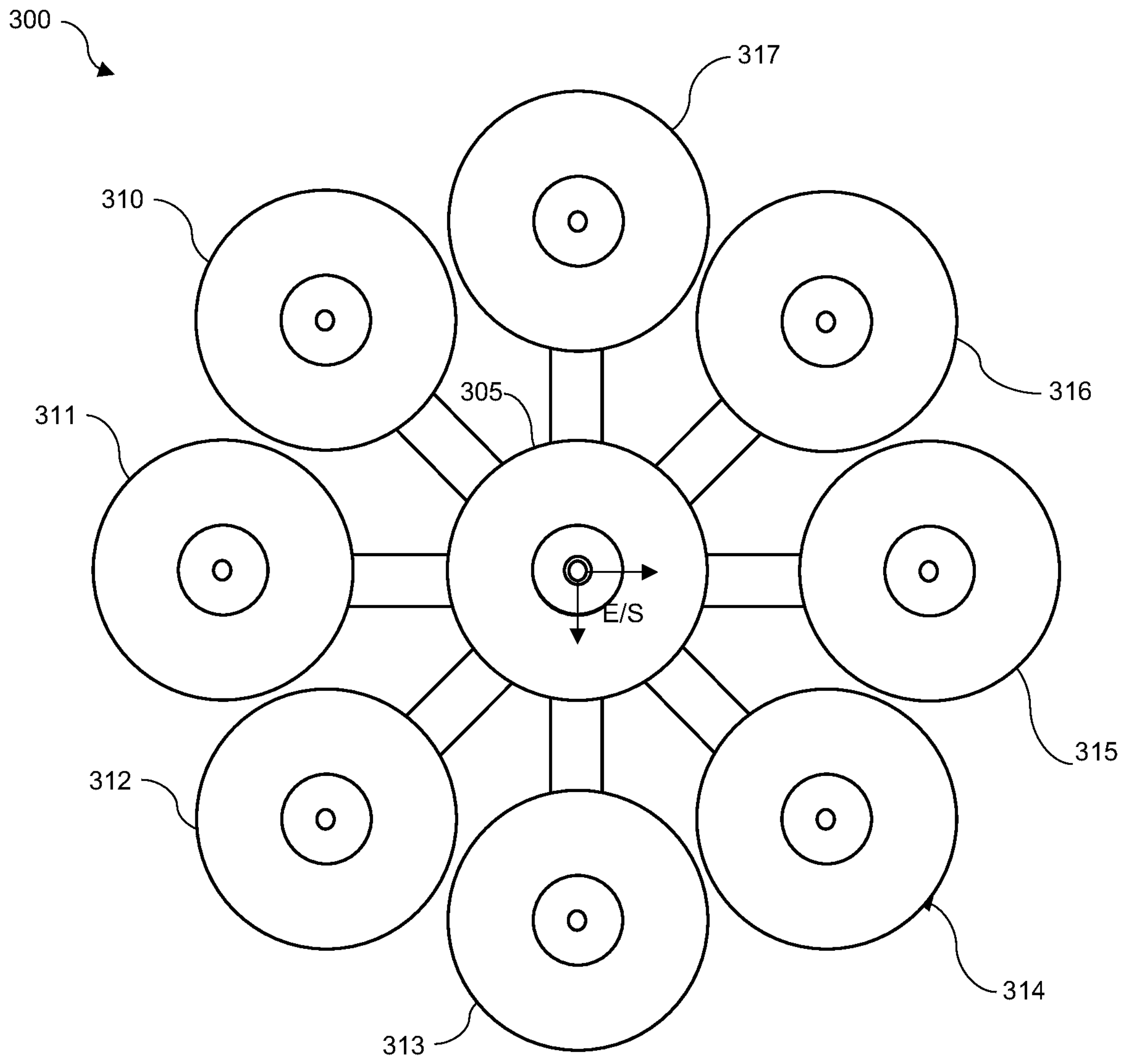
FIG. 3 illustrates architecture associated with a system including eight readout resonators with a central storage/entanglement hub, in accordance with the disclosed embodiments.

FIG. 3 illustrates another embodiment of multi readout cavity with a central entanglement/storage cavity system 300 in accordance with the disclosed embodiments. In the system 300 a central entanglement/storage cavity 305 is provided as a central storage/entanglement hub.

The system 300 further includes multiple readout cavities. In the exemplary embodiment illustrated in FIG. 3 eight such read out cavities 310-317 are shown, but in other embodiments, more or fewer readout cavities can be used without departing from the scope disclosed herein. In general, storage is the common hub that connects (or entangles) the different qubits together. Readout cavities may not be configured for storage.

The system 100, can be used to distribute a signal and collect it back from the cavities in system 300. In certain embodiments, each of the cavities can have a different staggered frequency. The different frequencies can be achieved by using cavities of different dimensions and/or cavity topology. Likewise, each line can include a filter configured to reduce insertion loss, and out-band rejection may be necessary to reduce cross talk between various channels. In this way the interference between the respective cavities can be minimized. In this embodiment, two multiplexers 100 can be used to distribute a signal and then collect the signal back from the eight readout cavities, each of which is staggered in frequency.

Figure 4A:
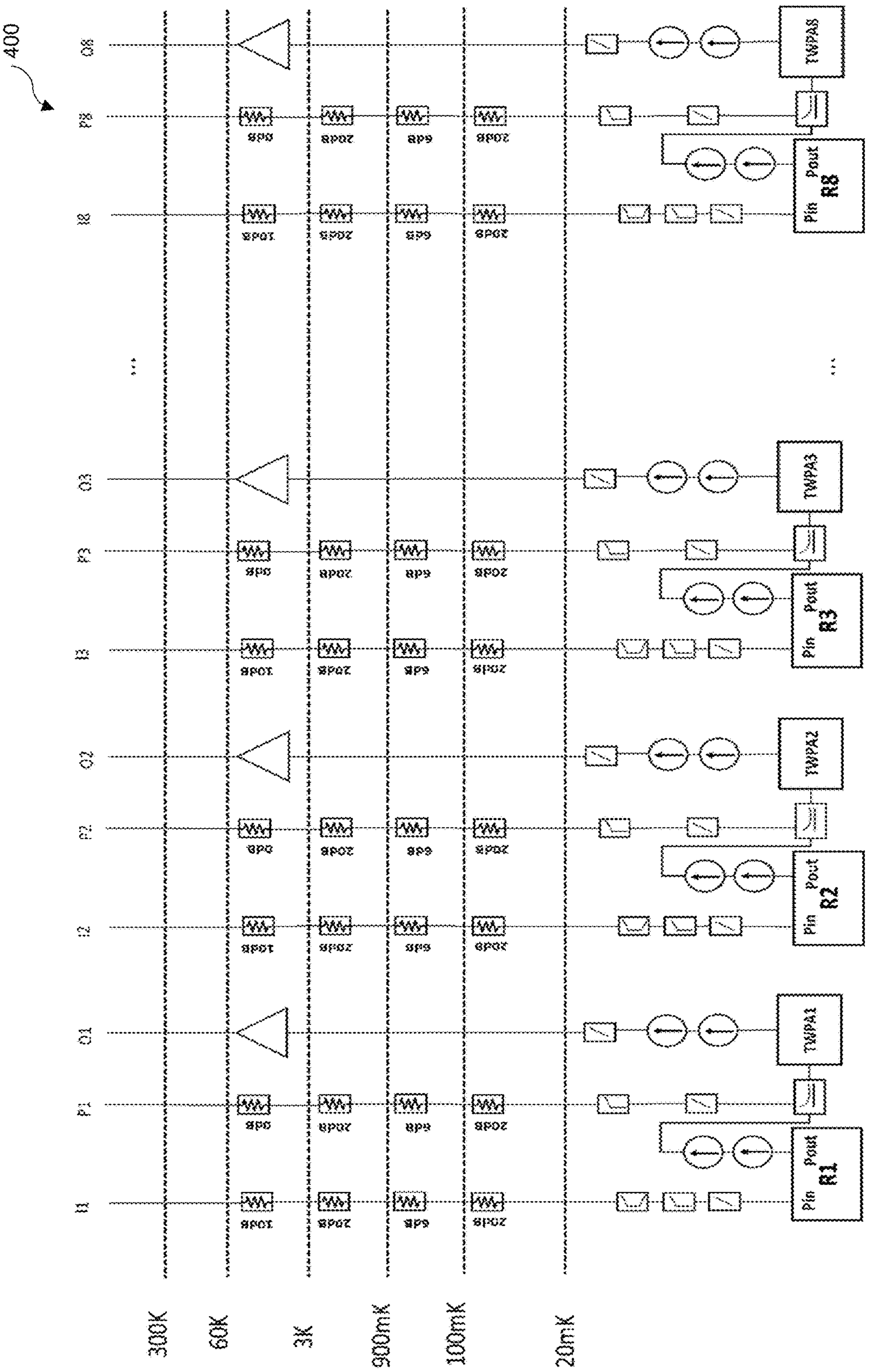
PRIOR ART FIG. 4A
FIG. 4A illustrates a prior art independent readout system for eight resonators.

FIG. 4A labeled as "prior art" is a block diagram 400 of an eight readout cavity. FIG. 4A illustrates an 8-channel individual readout system where each channel has its own input and output lines showing the complexity of the system and the large number of refrigerated RF lines required. As illustrated in FIG. 4A, a system without multiplexing is highly complex and requires numerous input/output lines.

Figure 4B:
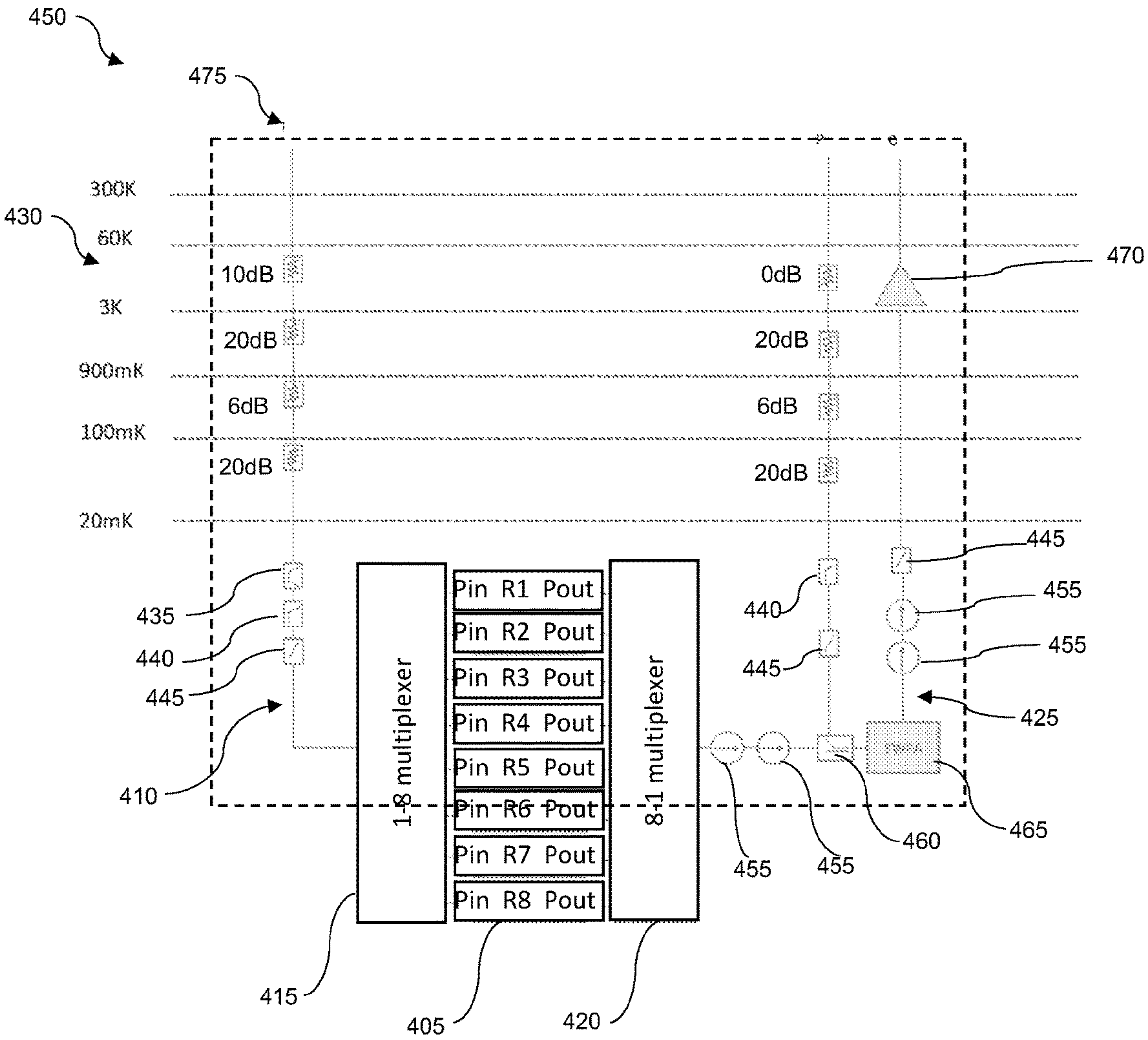
FIG. 4B illustrates a multiplexed 1-8-1 readout system utilizing the disclosed multiplexer, in accordance with the disclosed embodiments.

FIG. 4B illustrates a block diagram of a system 450 including eight readout cavities 405, multiplexed on a single input line 410 and a single output line 425 in accordance with the disclosed embodiments. The system is illustrated against a temperature gradient 430 showing temperatures for various components of the system 450. As illustrated the input line 410 can connect a bandpass filter 435, a lowpass filter 440, and an eccosorb filter 445 to, for example, a 1-8 multiplexer 415. It should be appreciated that the multiplexer 415 can be equivalent to the multiplexer illustrated in FIGS. 1A and 1B. The multiplexer 415 is then connected to an array of readout cavities 405. The array of readout cavities 405 can be staggered in frequency.

The readout cavities 405 then provide an output signal to another 8-1 multiplexer 420, which has a readout line 425 from which qubit readouts can be taken. Various components can be included in the readout path including two in series isolators 455, a directional coupler 460, a traveling wave parametric amplifier 465, two more in series isolators 455, an eccosorb filter 445 and a cryogenic amplifier 470. The directional coupler 460 can further direct a readout through an eccosorb filter 445 and a lowpass filter 440.

Figure 5:
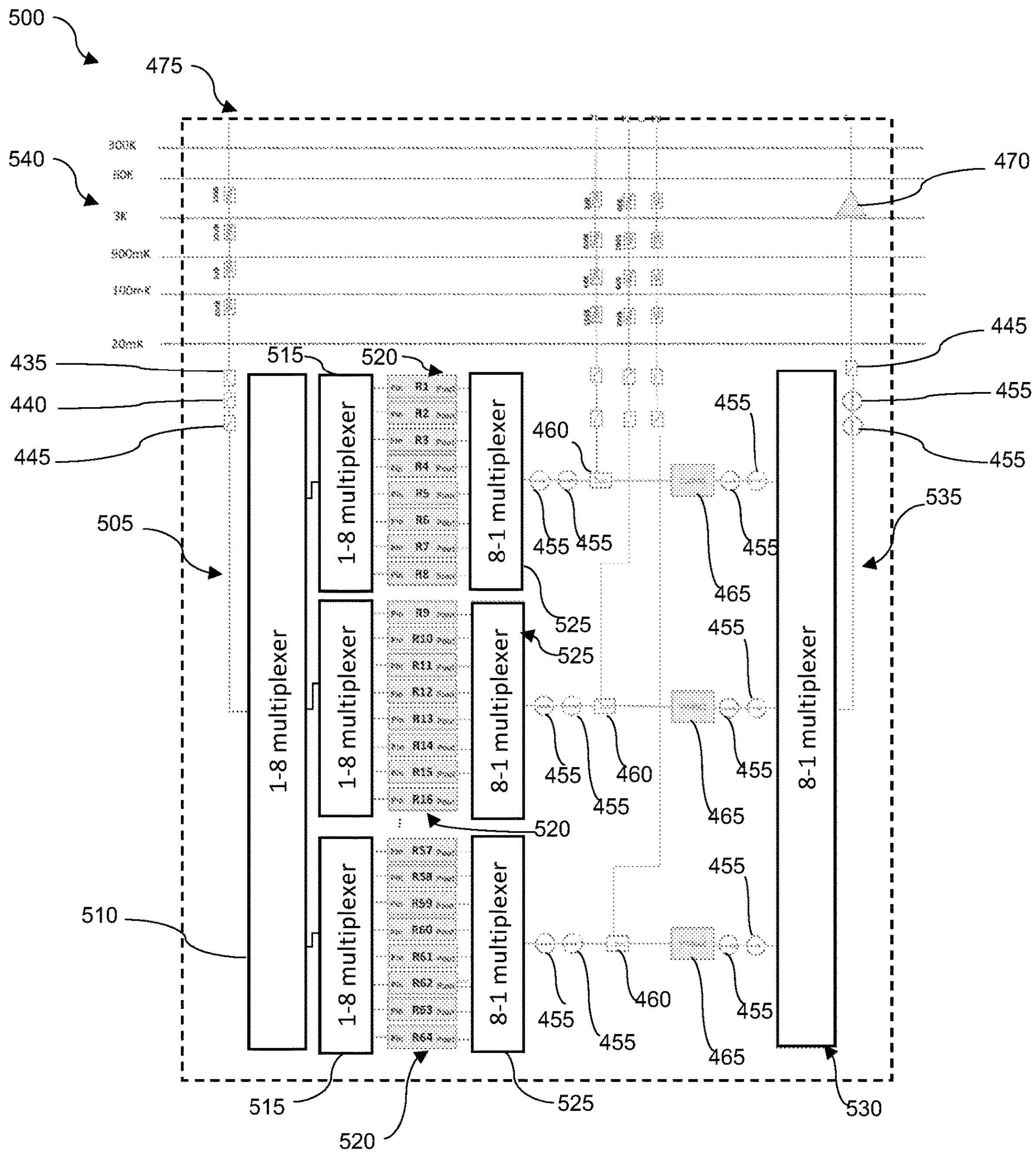
FIG. 5 illustrates a scaled up readout system for 64 readout cavities, in accordance with the disclosed embodiments.

FIG. 5 illustrates a scaled multiplexing system 500 in accordance with the disclosed embodiments. The system 500 includes various aspects illustrated in FIG. 1-4. Like features between FIG. 4 and FIG. 5 use like reference numerals. The scaled multiplexing system 500 takes advantage of the potential for parallel architecture made possible by the embodiments disclosed herein to expand the number of readout cavities.

As illustrated, a single input line 505 can be provided to a 1-8 multiplexer 510. The multiplexer 510 can comprise a multiplexer as detailed herein. The multiplexer 510 is then connected to additional multiplexers 515. Multiplexers 515 can comprise 1-8 multiplexers or other such multiplexers as required. The additional multiplexers 515 are each further connected to an array of readout cavities 520, the readout cavities 520 can then be connected to one of a series of multiplexers 525. The multiplexers 525 can then be connected to multiplexer 530 which can have a readout line 535 from which qubit readouts can be taken.

It should be appreciated that the multiplexers 510, multiplexers 515, multiplexers 525, and multiplexers 530 can be equivalent to the multiplexer illustrated in FIGS. 1A and 1B. It should further be appreciated that the number of multiplexers (and associated readout cavities) illustrated in FIG. 5 are exemplary. The system 500 is designed to be scalable and additional multiplexers and cavities can be used in other embodiments. The system is illustrated against a temperature gradient 540 showing temperatures for various components of the system 500.

Figure 6:
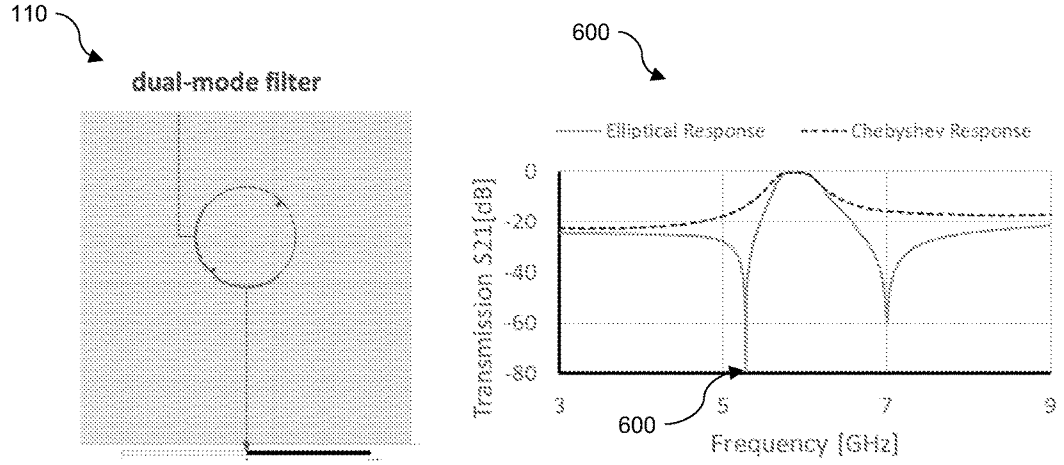
FIG. 6 depicts aspects of a dual mode filter and its attractive elliptical frequency response, in accordance with the disclosed embodiments.

FIG. 6 illustrates aspects of a dual mode filter, such as dual mode filter 110, in accordance with the disclosed embodiments. As illustrated in FIG. 6, the dual mode filter 110 can provide an elliptical filter response as illustrated in chart 600 showing transmission as a function of frequency. The elliptical response has two transmission zeros around each channel passband that comes from the dual mode filter design. This is particularly relevant for the disclosed embodiments where minimizing crosstalk is important.

Figure 7:
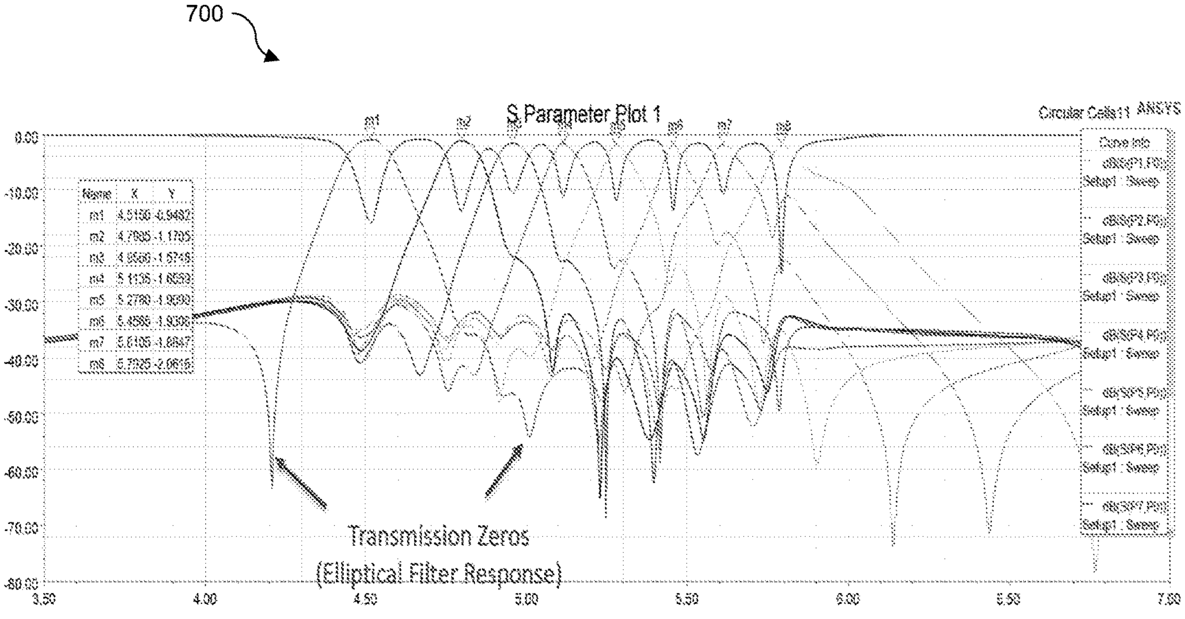
FIG. 7 illustrates the frequency response of the 1-8 multiplexer with eight staggered elliptical frequency responses utilizing dual mode filter, in accordance with the disclosed embodiments.

It is important to note that insertion loss must be minimized at the output chain. Out-band rejection is also important to reduce cross talk between various channels. The dual mode filters provide excellent out-band rejection between various channels of the multiplexer. This is illustrated in chart 700, provided in FIG. 7, which shows transmission zeros resulting from the elliptical filter response of the dual mode filters disclosed herein.

Figure 8:
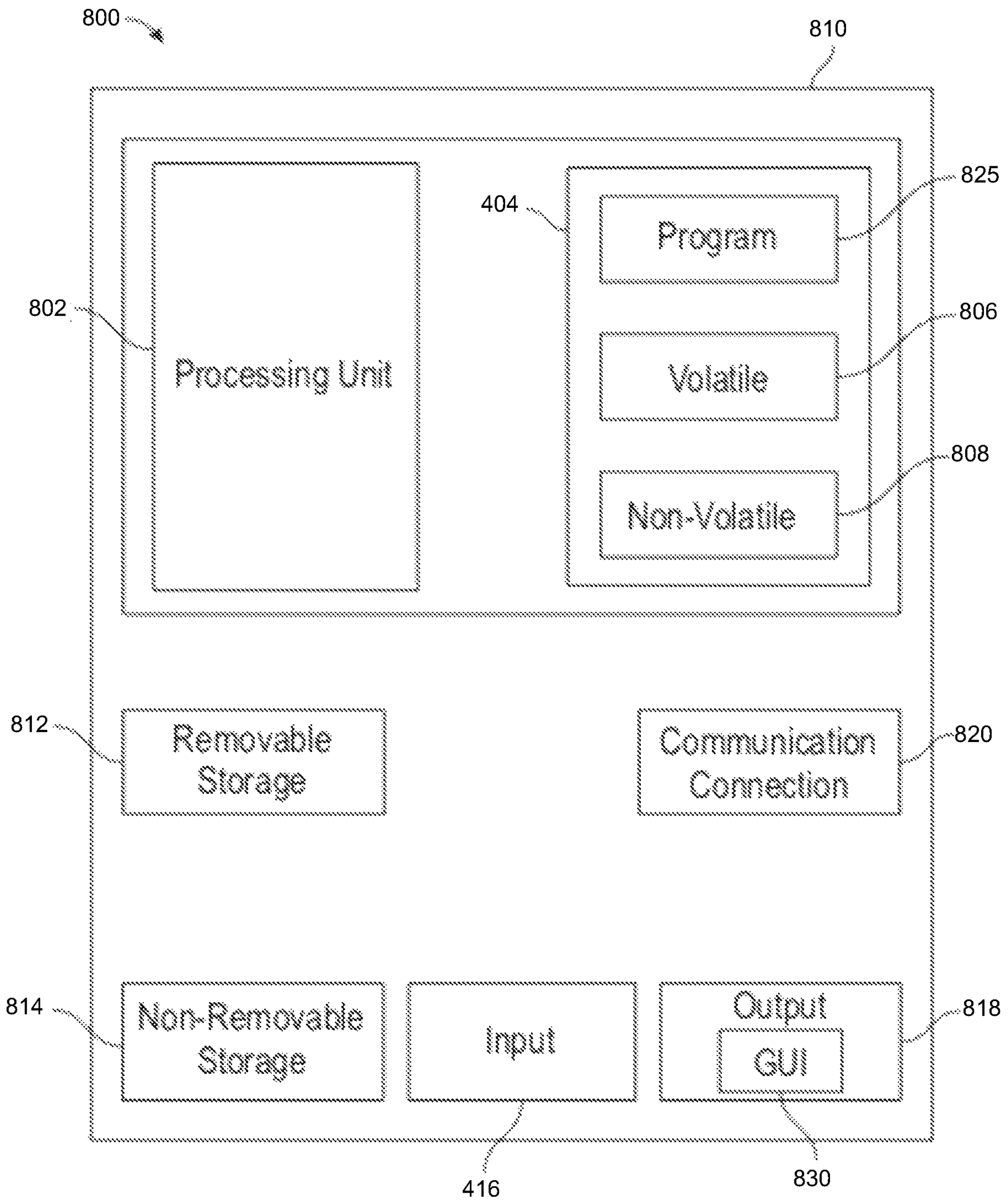
FIG. 8 depicts a block diagram of a computer system which is implemented in accordance with the disclosed embodiments.
Figure 9:
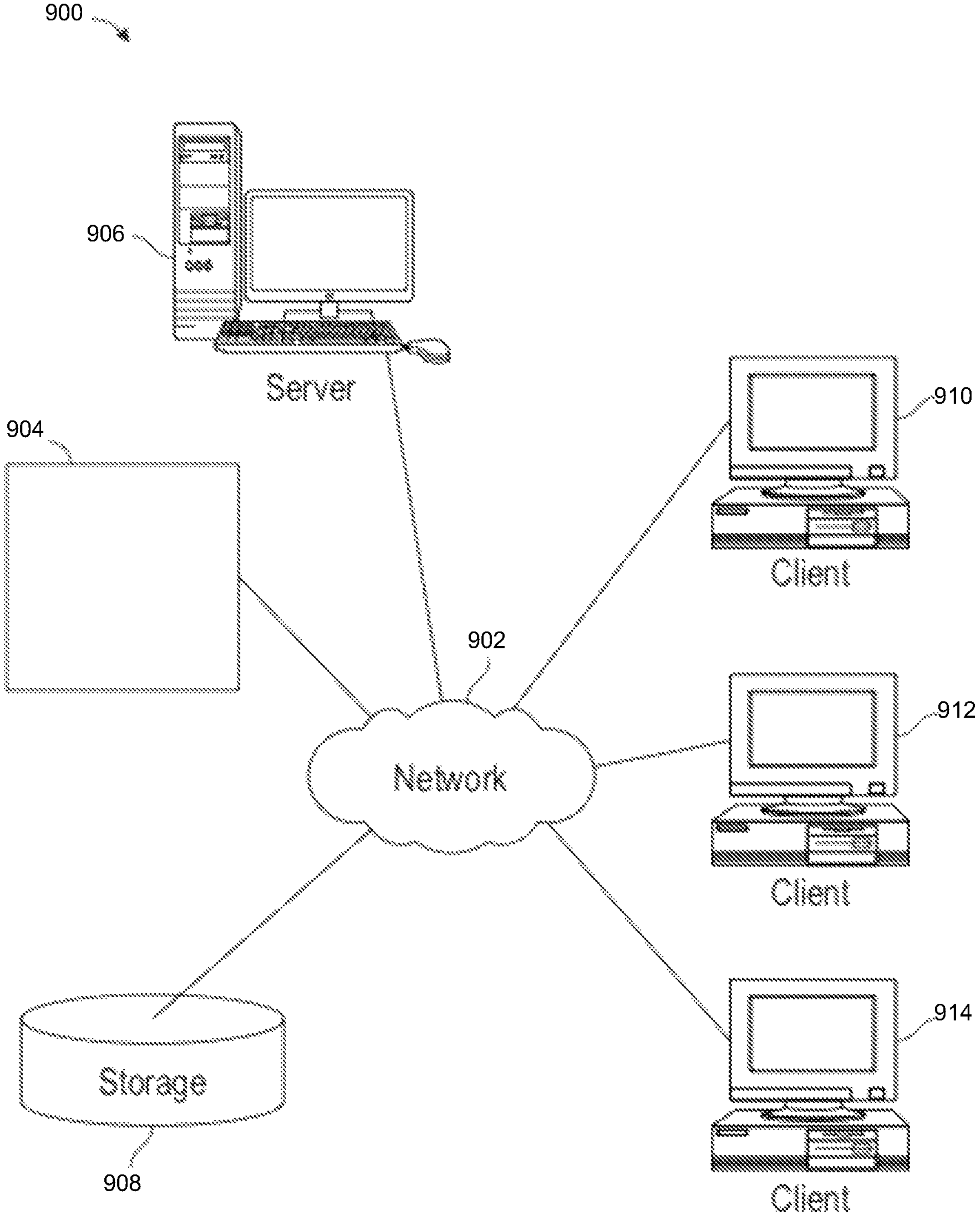
FIG. 9 depicts a graphical representation of a network of data-processing devices in which aspects of the present embodiments may be implemented.
Figure 10:
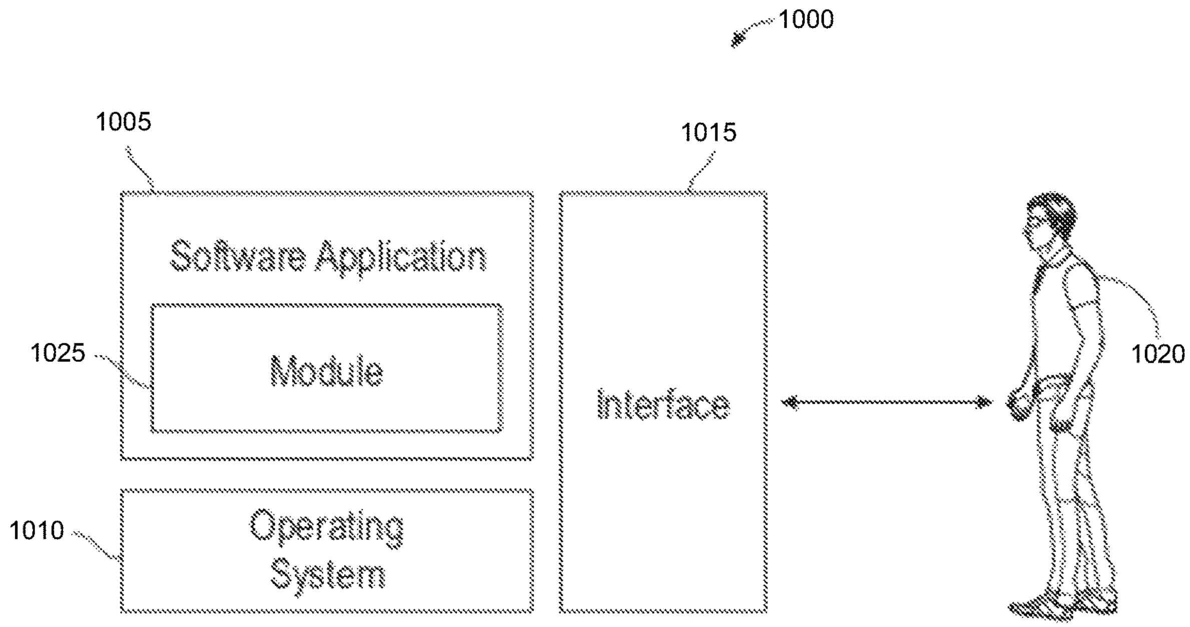
FIG. 10 depicts a computer software system for directing the operation of the data-processing system depicted in FIG. 4, in accordance with an embodiment.

FIGS. 8-10 are provided as exemplary diagrams of data-processing environments in which embodiments can be implemented. It should be appreciated that FIGS. 8-10 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments. It should be further appreciated that these computer environments can be representative of classical computing system or quantum computing systems.

A block diagram of a computer system 800 that executes programming for implementing parts of the methods and systems disclosed herein is shown in FIG. 8. A computing device in the form of a computer 810 configured to interface with sensors, peripheral devices, and other elements disclosed herein may include one or more processing units 802, memory 804, removable storage 812, and non-removable storage 814. Memory 804 may include volatile memory 806 and non-volatile memory 808. Computer 810 may include or have access to a computing environment that includes a variety of transitory and non-transitory computer-readable media such as volatile memory 806 and non-volatile memory 808, removable storage 812 and non-removable storage 814. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 810 may include or have access to a computing environment that includes input 816, output 818, and a communication connection 820. The computer may operate in a networked environment using a communication connection 820 to connect to one or more remote computers, remote sensors, detection devices, hand-held devices, multi-function devices (MFDs), mobile devices, tablet devices, mobile phones, Smartphones, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 9 below.

Output 818 is most commonly provided as a computer monitor, but may include any output device. Output 818 and/or input 816 may include a data collection apparatus associated with computer system 800. In addition, input 816, which commonly includes a computer keyboard and/or pointing device such as a computer mouse, computer track pad, or the like, allows a user to select and instruct computer system 800. A user interface can be provided using output 818 and input 816. Output 818 may function as a display for displaying data and information for a user, and for interactively displaying a graphical user interface (GUI) 830.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 816 such as, for example, a pointing device such as a mouse and/or with a keyboard. A particular item can function in the same manner to the user in all applications because the GUI provides standard software routines (e.g., module 825) to handle these elements and report the user's actions. The GUI can further be used to display the electronic service image frames as discussed below.

Computer-readable instructions, for example, program module or node 825, which can be representative of other modules or nodes described herein, are stored on a computer-readable medium and are executable by the processing unit 802 of computer 810. Program module or node 825 may include a computer application. A hard drive, CD-ROM, RAM, Flash Memory, and a USB drive are just some examples of articles including a computer-readable medium.

FIG. 9 depicts a graphical representation of a network of data-processing systems 900 in which aspects of the present invention may be implemented. Network data-processing system 900 is a network of computers or other such devices such as mobile phones, smartphones, sensors, detection devices, controllers, and the like in which embodiments of the present invention may be implemented. Note that the system 900 can be implemented in the context of a software module such as program module 825. The system 900 includes a network 902 in communication with one or more clients 910, 912, and 914. Network 902 may also be in communication with one or more devices 904, servers 906, and storage 908. Network 902 is a medium that can be used to provide communications links between various devices and computers connected together within a networked data processing system such as computer system 800. Network 902 may include connections such as wired communication links, wireless communication links of various types, fiber optic cables, quantum, or quantum encryption, or quantum teleportation networks, etc. Network 902 can communicate with one or more servers 906, one or more external devices such as a controller, actuator, particle accelerator, associated electron beam accelerator, or other such device 904, and a memory storage unit such as, for example, memory or database 908. It should be understood that device 904 may be embodied as a system for displaying the readout of a readout device, detector device, microcontroller, controller, receiver, transceiver, or other such device.

In the depicted example, device 904, server 906, and clients 910, 912, and 914 connect to network 902 along with storage unit 908. Clients 910, 912, and 914 may be, for example, personal computers or network computers, handheld devices, mobile devices, tablet devices, smartphones, personal digital assistants, microcontrollers, recording devices, MFDs, etc. Computer system 800 depicted in FIG. 8 can be, for example, a client such as client 910 and/or 912.

Computer system 800 can also be implemented as a server such as server 906, depending upon design considerations. In the depicted example, server 906 provides data such as boot files, operating system images, applications, and application updates to clients 910, 912, and/or 914. Clients 910, 912, and 914 and external device 904 are clients to server 906 in this example. Network data-processing system 900 may include additional servers, clients, and other devices not shown. Specifically, clients may connect to any member of a network of servers, which provide equivalent content.

In the depicted example, network data-processing system 900 is the Internet with network 902 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 900 may also be implemented as a number of different types of networks such as, for example, an intranet, a local area network (LAN), or a wide area network (WAN). FIGS. 8 and 9 are intended as examples and not as architectural limitations for different embodiments of the present invention.

FIG. 10 illustrates a software system 1000, which may be employed for directing the operation of the data-processing systems such as computer system 800 depicted in FIG. 8. Software application 1005, may be stored in memory 804, on removable storage 812, or on non-removable storage 814 shown in FIG. 8, and generally includes and/or is associated with a kernel or operating system 1010 and a shell or interface 1015. One or more application programs, such as module(s) or node(s) 825, may be "loaded" (i.e., transferred from removable storage 812 into the memory 804) for execution by the data-processing system 800. The data-processing system 800 can receive user commands and data through user interface 1015, which can include input 816 and output 818, accessible by a user 1020. These inputs may then be acted upon by the computer system 800 in accordance with instructions from operating system 1010 and/or software application 1005 and any software module(s) 825 thereof.

Generally, program modules (e.g., module 825) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, hand-held devices, mobile phones, smart phones, tablet devices, multi-processor systems, printers, copiers, fax machines, multi-function devices, data networks, microprocessor-based or programmable consumer electronics, networked personal computers, minicomputers, mainframe computers, servers, medical equipment, medical devices, and the like.

Note that the term module or node as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module), and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 1015 (e.g., a graphical user interface 830) can serve to display results, whereupon a user 1020 may supply additional inputs or terminate a particular session. In some embodiments, operating system 1010 and GUI 830 can be implemented in the context of a "windows" system. It can be appreciated, of course, that other types of systems are possible. For example, rather than a traditional "windows" system, other operation systems such as, for example, a real time operating system (RTOS) more commonly employed in wireless systems may also be employed with respect to operating system 1010 and interface 1015. The software application 1005 can include, for example, module (s) 825, which can include instructions for carrying out steps or logical operations such as those shown and described herein.

The description is presented with respect to embodiments of the present invention, which can be embodied in the context of, or require the use of a data-processing system such as computer system 800, in conjunction with program module 825, and data-processing system 900 and network 902 depicted in FIGS. 8-10. The present invention, however, is not limited to any particular application or any particular environment. Instead, those skilled in the art will find that the systems and methods of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation. In other embodiments, manual control of various aspects may be achievable while closely monitoring readbacks.

Based on the foregoing, it can be appreciated that a number of embodiments are disclosed herein. For example, in an embodiment, a system for multiplexed readout of quantum devices, comprises at least one radial combiner and at least one filter operably connected to the radial combiner. In an embodiment, the filter comprises a dual mode filter. In an embodiment, the dual mode filter provides an elliptical filter response.

In an embodiment, the system for multiplexed readout of quantum devices further comprises a port connecting each of the at least one radial combiner and the at least one filter. In an embodiment, the radial combiner comprises a center feed line, at least one radial line, and at least one waveguide port. In an embodiment, the center feed line further comprises a waveguide section and a mode transducer section. In an embodiment, the system for multiplexed readout of quantum devices further comprises at least one readout cavity. the readout cavity can comprise an RF cavity for reading out qubits.

In another embodiment, a system for multiplexed readout of quantum devices comprises a first multiplexer configured to accept an input, a plurality of readout cavities operably connected to said first multiplexer, and a second multiplexer operably connected to the plurality of readout cavities, the second multiplexer configured to provide an output.

In an embodiment, the first multiplexer comprises at least one radial combiner, and at least one filter operably connected to the radial combiner, and wherein the second multiplexer comprises at least one radial combiner and at least one filter operably connected to the radial combiner. In an embodiment, wherein each of the respective filters comprises a dual mode filter. The dual mode filter provides an elliptical filter response. In an embodiment, a port connects each of the at least one radial combiner and the at least one filter. In an embodiment, the radial combiner comprises a center feed line, at least one radial line, and at least one waveguide port. In an embodiment, each of the plurality of readout cavities comprises an RF cavity for reading out qubits.

In another embodiment, a system for multiplexed readout of quantum devices, comprises a first multiplexer configured to accept an input, a plurality of input scaling multiplexers attached to the first multiplexer, a plurality of readout cavities operably connected to the plurality of input scaling multiplexers, a plurality of output scaling multiplexers operably connected to the plurality of readout cavities, and a second multiplexer operably connected to the plurality of output scaling multiplexers, the second multiplexer configured to provide an output.

In an embodiment, the first multiplexer comprises: at least one radial combiner and at least one filter operably connected to the radial combiner; and the second multiplexer comprises: at least one radial combiner and at least one filter operably connected to the radial combiner. In an embodiment, the plurality of input scaling multiplexers each comprises at least one radial combiner and at least one filter operably connected to the radial combiner; and the plurality of output scaling multiplexers each comprises: at least one radial combiner and at least one filter operably connected to the radial combiner. In an embodiment, each of the respective filters comprises a dual mode filter.

In an embodiment each of the plurality of readout cavities comprises an RF cavity for reading out qubits.

It will be appreciated that variations of the above-disclosed and other features and functions, or alternatives thereof, may be desirably combined into many other different systems or applications. Also, various presently unforeseen or unanticipated alternatives, modifications, variations, or improvements therein may be subsequently made by those skilled in the art which are also intended to be encompassed by the following claims.

What is claimed is:

1. A system for multiplexed readout of quantum devices, comprising:

at least one radial combiner comprising:

a center feed line; and a plurality of radial lines; and at least one dual mode filter operably connected to the radial combiner, wherein the dual mode filter provides an elliptical filter response.

2. The system for multiplexed readout of quantum devices of claim 1 further comprising:

a port connecting each of the at least one radial combiner and the at least one filter.

3. The system for multiplexed readout of quantum devices of claim 1, wherein the radial combiner comprises:

at least one waveguide port.

4. The system for multiplexed readout of quantum devices of claim 3 wherein the center feed line further comprises:

a waveguide section; and a mode transducer section.

5. The system for multiplexed readout of quantum devices of claim 1, further comprising:

at least one readout cavity.

6. The system for multiplexed readout of quantum devices of claim 5 wherein the readout cavity comprises:

an RF cavity for reading out qubits.

7. A system for multiplexed readout of quantum devices, comprising:

a first multiplexer configured to accept an input, the first multiplexer further comprising a radial combiner operably connected to at least one dual mode filter, wherein the dual mode filter provides an elliptical filter response;

a plurality of readout cavities operably connected to said first multiplexer;

a second multiplexer operably connected to the plurality of readout cavities, the second multiplexer configured to provide an output.

8. The system for multiplexed readout of quantum devices of claim 7, wherein the second multiplexer comprises:

at least one radial combiner; and at least one filter operably connected to the radial combiner.

9. The system for multiplexed readout of quantum devices of claim 8, wherein the at least one filter comprises:

a dual mode filter.

10. The system for multiplexed readout of quantum devices of claim 9 wherein the dual mode filter provides an elliptical filter response.

11. The system for multiplexed readout of quantum devices of claim 7 further comprising:

a port connecting each of the at least one radial combiner and the at least one filter.

12. The system for multiplexed readout of quantum devices of claim 7, wherein the radial combiner comprises:

a center feed line;

at least one radial line; and at least one waveguide port.

13. The system for multiplexed readout of quantum devices of claim 7 wherein each of the plurality of readout cavities comprises:

an RF cavity for reading out qubits.

14. A system for multiplexed readout of quantum devices, comprising:

a first multiplexer configured to accept an input;

a plurality of input scaling multiplexers attached to the first multiplexer;

a plurality of readout cavities operably connected to the plurality of input scaling multiplexers;

a plurality of output scaling multiplexers operably connected to the plurality of readout cavities; and a second multiplexer operably connected to the plurality of output scaling multiplexers, the second multiplexer configured to provide an output.

15. The system for multiplexed readout of quantum devices of claim 14, wherein the first multiplexer comprises:

at least one radial combiner; and at least one filter operably connected to the radial combiner; and wherein the second multiplexer comprises:

at least one radial combiner; and at least one filter operably connected to the radial combiner.

16. The system for multiplexed readout of quantum devices of claim 14, wherein the plurality of input scaling multiplexers each comprises:

at least one radial combiner; and at least one filter operably connected to the radial combiner; and wherein the plurality of output scaling multiplexers each comprises:

at least one radial combiner; and at least one filter operably connected to the radial combiner.

17. The system for multiplexed readout of quantum devices of claim 15, wherein each of the plurality of readout cavities has a staggard frequency from each of the other readout cavities in the plurality of readout cavities.

18. The system for multiplexed readout of quantum devices of claim 14 wherein each of the plurality of readout cavities comprises:

an RF cavity for reading out qubits.

* * * * *